Aug. 7, 1956 P. EISLER 2,758,256

ELECTRIC CIRCUIT COMPONENTS

Filed Sept. 30, 1952 5 Sheets-Sheet 1

Inventor
PAUL EISLER
By Frederick E. Hay
Attorney

ELECTRIC CIRCUIT COMPONENTS

Filed Sept. 30, 1952 5 Sheets-Sheet 2

Inventor
PAUL EISLER
By Frederick E. Hane
Attorney

Inventor
PAUL EISLER
By Frederick E. Hane
Attorney

Aug. 7, 1956 P. EISLER 2,758,256

ELECTRIC CIRCUIT COMPONENTS

Filed Sept. 30, 1952 5 Sheets-Sheet 4

Inventor
PAUL EISLER
By [signature]
Attorney

Inventor
PAUL EISLER
By [signature]
Attorney 2,758,256

ELECTRIC CIRCUIT COMPONENTS

Paul Eisler, London, England, assignor to Technograph Printed Circuits Limited, London, England, a company of Great Britain Application September 30, 1952, Serial No. 312,370

Claims priority, application Great Britain October 3, 1951

22 Claims. (Cl. 317—101)

This invention relates to electric circuit components, more particularly, but not exclusively, for use in printed circuits of which the components may form an integral part.

It has been proposed to incorporate electric circuit components in the body of a printed circuit, for instance by painting on areas or bands of resistance paint or dielectric material. In many cases it is desirable that a printed circuit should be flexible so that it can be folded, or that the actual electrical values of the components should be adjustable, for instance by trimming away parts of them, but a major problem in such cases is to provide a circuit in which the specific electrical values of the components will remain stable when subjected to such mechanical stressing. It is one object of the invention to provide a solution to this problem.

Thus according to the present invention a basic electric circuit component comprises at least two separate highly conductive areas and a multiplicity of paths of an impedance determining material connecting the highly conductive areas, and the highly conductive areas and the impedance determining material are so disposed as to provide a region in which the component can be subjected to mechanical stressing without significantly affecting the electrical values of the effective paths of impedance determining material.

The term "impedance determining material" is sometimes used in this specification to define material which when used in an electrical component determines by its nature the impedance of the component. For example, resistance material, semi-conductors and dielectric material fall within the scope of the term "impedance determining material" for the impedance of a resistor depends upon the resistivity of the material of which it is composed, while the resistance in one direction or the other of a semi-conductor similarly depends upon the properties of the material, and the impedance of a capacitor depends upon the dielectric constant of its dielectric material.

Where, hitherto, components have formed an integral part of a printed circuit it has generally been necessary to design the components so that they shall have, as nearly as possible, the desired values ab initio. It is a further object of the present invention to provide a basic electric circuit component which can be readily modified to provide components having a wide variety of values, so that the same basic component can be used as a source of components suitable for a variety of different applications.

Thus the highly conductive areas and the impedance determining material may be so disposed that mechanical stressing comprising severance of a highly conductive area in the said region alters the effective number or the manner of interconnection of the paths of impedance determining material, and so alters the electrical value of the component. In this way circuit components of a variety of different electrical values can be produced from the basic component by severing highly conductive areas in different places in the said region.

The mechanical stressing is not confined to severance of conductors for adjusting the electrical value of the component. For instance, in some cases the effect required may be an alteration in the spatial configuration of the component rather than an alteration in electrical value, in which cases the mechanical stressing may comprise distorting the component as by bending, folding or rolling it in the said region without distorting the effective paths of electrically active material.

In one form of the present invention the separate highly conductive areas are supported on one side of an insulating base and are connected together by a multiplicity of paths of the impedance determining material, which paths are also supported on this side of the insulating base. For instance, the basic component may comprise a base of insulating material supporting a thin conductive pattern consisting of at least two separate areas, one of these areas including a plurality of branches which are interdigitated between but spaced from branches of another area of the conductive pattern, and the paths of impedance determining material bridge these branches.

In another form of the invention separate highly conductive areas are supported on opposite sides of a sheet of the impedance determining material and the said paths extend through the thickness of the sheet from a highly conductive area on one side of the sheet to an overlapping highly conductive area on the opposite side of the sheet. Conveniently, there are several separate highly conductive areas on each side of the sheet, each area overlapping with highly conductive areas on the opposite side of the sheet, and only two of these areas constitute terminals for connection to other parts of an electric circuit, the other areas being electrically isolated except through the impedance determining material.

The invention is capable of very wide application and there are numerous ramifications within its general scope. Accordingly, in order that the nature and advantages of the invention may be more readily appreciated, various particular applications of the invention will be described by way of example with reference to the accompanying diagrammatic drawings, in which.

Figure 1:
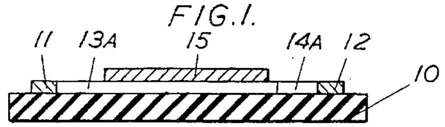
Figures 1 and 2 are a cross-section and a plan respectively of a simple form of basic resistor component.

In the plan views shown in the drawings the highly conductive areas have been shaded for greater clarity.

In the drawings, parts which are substantially identical in more than one example have been denoted by the same reference characters.

Figure 2:
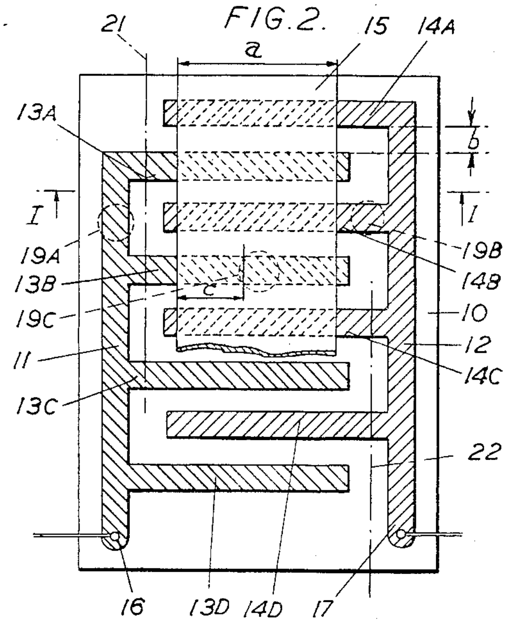

The basic resistor component shown in Figures 1 and 2 consists of a base or support 10 of a thin flexible insulating sheet material, for instance impregnated paper or a plastic such as a solidified film of an epoxy resin. On one surface of the base is a thin conductive pattern consisting of two separate areas. The pattern comprises two parallel conductive stems 11 and 12 with a plurality of branches 13A to 13D extending from the stem 11, and similar branches 14A to 14D extending from the stem 12. The branches as shown in the drawing extend at right angles to the stems, but they may be inclined to the stems for certain applications. The branches extending from one stem stop short of the other stem, while the branches 13A to 13D are interdigitated between and spaced from the similar branches 14A to 14D extending from the other stem, so that, except for the end branches 13D and 14A, each branch lies between two branches extending from the other stem.

The material and method of production of the conductive pattern form no part of the present invention, but it may be stated that a suitable conductive pattern can be formed of copper foil, for instance, by a printed circuit technique. One such technique, as described in United States Patent No. 2,441,960 comprises bonding a thin copper foil to the base 10, printing over the foil in an etch resistant ink a representation of the conductive pattern, etching away all the copper that is not protected by the ink pattern, and thereafter removing the ink to expose the desired conductive pattern bonded to the base.

To provide the resistance paths a band 15 of resistance material is applied to bridge the branches of the conductive pattern. The width *a* of the band of resistance material is less than the distance between the stems 11 and 12 so that there are spaces between the extreme edges of the resistance material and the stems.

The resistance material can be applied in any convenient manner. For instance, a resistance paint such as a resin loaded with carbon particles can be painted on or applied by some other coating process. Again, a semi-cured resinous resistance layer supported on a tape, such as is sometimes employed in printed circuit techniques, may be applied as an adhesive label and the curing completed in situ. Good electrical contact between the conductive branches and the resistance material is essential, and if necessary special means may be adopted to promote this. Thus, if the resistance material is such that it will not readily adhere to the metal of the conductive branches the desired good contact may still be achieved by causing the resistance material to adhere strongly to the insulating base material 10 which is exposed between the branches. For this to be fully effective, however, the conductive branches should be very thin or should be countersunk into the base. Another procedure which may be adopted is to employ a conductive cement between the surfaces of the conductive branches and the resistance material. In this case the resistance material may be a fully cured resin-carbon film on an insulating tape, for instance an impregnated asbestos paper tape, and the conductive cement may be an ink applied over the conductive branches, this ink consisting of carbon and partially cured resin. The resistance tape is then bonded to the branches by the application of heat and pressure. The very thinness of the conductive cement renders immaterial any irregularities in its electrical conductivity. In certain cases the conductive cement may have been used as the protective ink during the production of the conductive pattern by a printed circuit technique involving an etching procedure, such as the technique described above. A further procedure is to produce a very thin layer of a solder on the underside of the resistance material and then to heat the resistance material when it is in place over the conductive branches. In the areas of the branches the solder remains and unites the resistance material to the branches, but in the areas between the branches the molten solder runs towards the metal of the branches and so removes any danger of short-circuiting the resistor through the solder layer. Yet another procedure would be to create the branches as parallel metallic lines on the tape which carries the resistance material, so that the branches and the resistance material are in initimate contact from the outset. In this case the tape should be wide enough to cover the stems of the conductive pattern. The branches, which should be made from easily solderable metal such as heavily tinned copper foil, must overlap the stems. To connect the branches to the stems a suitable length of tape may be hot-rolled over the base bearing the conductive pattern of stems so that the branches are sweated on to the stems at the places where they overlap. One advantage of this form of the invention is that it affords an opportunity for providing a coarse adjustment of the resistance value of the component during the application of the tape, since by measuring the resistance value during the application of the tape the rolling process can be terminated when the resistance value approaches the desired value for the component. A fine adjustment of the resistance value can thereafter be carried out as hereinafter described. Where a liquid adhesive or other liquid agent is employed for securing the resistance material, it is desirable that the base 10 should be porous to facilitate evaporation of the liquid.

Having produced the basic component shown in Figures 1 and 2 with the resistance material 15 making good contact with the conductive branches 13A to 13D and 14A to 14D, the basic component may be tested for its ohmic value across the terminals 16 and 17 of the stems 11 and 12 respectively.

Figures 3, 4, 5, 6, 7, 8:
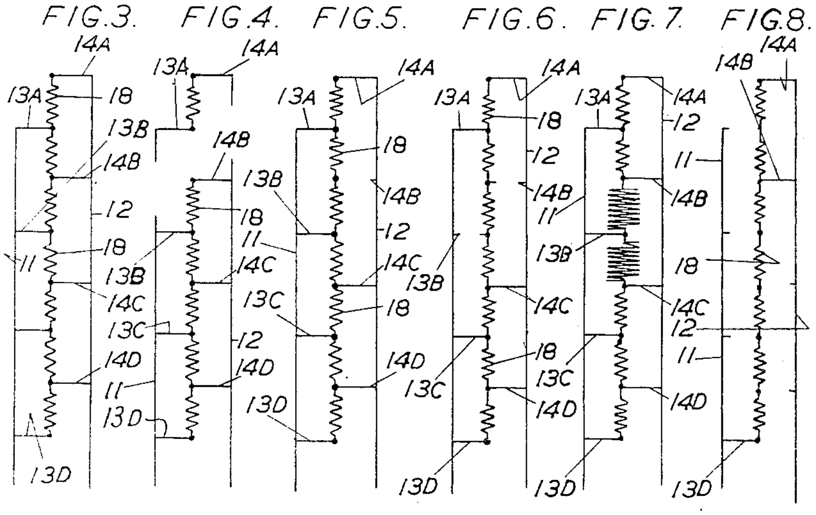
Figures 3 to 8 represent diagrammatically different forms of resistors which can be made from the basic component shown in Figures 1 and 2.

In this form the basic component comprises, in effect, a plurality of resistance paths or resistor units 18 connected in parallel, as shown diagrammatically in Figure 3. Each resistor unit 18 corresponds to a section of the resistance material of width *a* and length *b*, *b* being the minimum distance between adjacent conductive branches.

The resistance band 15 does not extend for the full width of the conductive pattern, so that the component may be mechanically stressed (e. g. punched, cut or bent) in places outside the boundaries of the resistance band 15 without affecting the ohmic value of any of the resistor units. Also, since along any of the branches 14A to 13D the resistance material is shortcircuited by the metal of the conductive pattern in contact with it, the component can be mechanically stressed along any of these branches without affecting the ohmic value of any of the resistor units.

The basic component can be used to provide resistors of a wide variety of different values. Thus the ohmic value may be increased by cutting off an appropriate length of the basic component. For instance, cutting along the line I—I in Figure 2 produces the resistor shown diagrammatically in Figure 4, in which the ohmic value, instead of corresponding to seven resistance units 18 connected in parallel now corresponds to only five of these units connected in parallel. Instead of cutting off a portion of the basic component a similar effect can be achieved merely by severing the electrical connections to the appropriate resistor units, for instance by punching a hole 19A through the stem 11 between the branches 13A and 13B.

Another way of modifying the ohmic value would be to sever one of the branches, for instance the branch 14B, by punching in it a hole 19B to produce the component shown in Figure 5. In this case the resistor units between the branches 13A and 13B are rendered non-effective, so that the ohmic value of the component will be the same as that in Figure 4, namely five resistor units connected in the parallel. By severing two of the branches from the same stem, for instance the branch 14C as well as the branch 14B, the ohmic value would then correspond to only three resistor units connected in parallel.

Another way of modifying the ohmic value is to sever two or more of the branches from opposite stems. For instance, if the branches 13B and 14B are severed the component shown in Figure 6 will result. In this case, the chain of three resistor units immediately above the branch 14C is in parallel with each of the four remaining individual units.

It will be appreciated therefore, that numerous combinations of punchings can be made to achieve a variety of different ohmic values.

A finer adjustment of ohmic value can be achieved by shortening the effective width of one or more of the resistor units by reducing the length of one or more of the branches. This may be done by punching a hole through one of the branches in the region covered by the resistance band, for instance the hole 19C shown in Figure 2. This reduces the effective width of the two resistor units extending from the branch 13B to the branches 14B and 14C respectively, the effective width of these units now being *c* instead of *a*. The effect of such adjustment is shown in Figure 7.

The adjustment of the ohmic value can if desired be effected automatically by connecting an ohm meter or similar instrument between the terminals 16 and 17 using the indication of the instrument as the controlling influence for an automatic cutter which progressively removes slices from one end of the basic component, or for an automatic punching machine which punches a succession of holes through the stems and/or the branches. The arrangement may be such that the cutter is stopped when the instrument reading reaches a predetermined value in the vicinity of the desired ohmic value for the required resistor. The fine adjustment of the ohmic value can then be made by hand or, if preferred, by setting the automatic cutter or punching machine so that it progressively cuts off short lengths from one or more of the branches, or punches a series of closely pitched holes along a branch or branches, as the case may be, until the desired ohmic value of the resistor is obtained.

Another way in which the ohmic value can be adjusted is by slitting the component in the direction at right angles to the branches, i. e. parallel to the stems 11 and 12. For instance, by slitting the component from one end along the space between the stem 11 and the resistance band 15, as shown by the line 21, and slitting it from the other end along the space between the stem 12 and the resistance band 15, as shown by the line 22, until the slits overlap, that portion of the resistance band lying between the overlapping parts of the slits becomes the only effective portion. As shown in Figure 8, for slits of the lengths indicated this will comprise five resistor units connected in series between the branches 13D and 14B.

Figure 9:
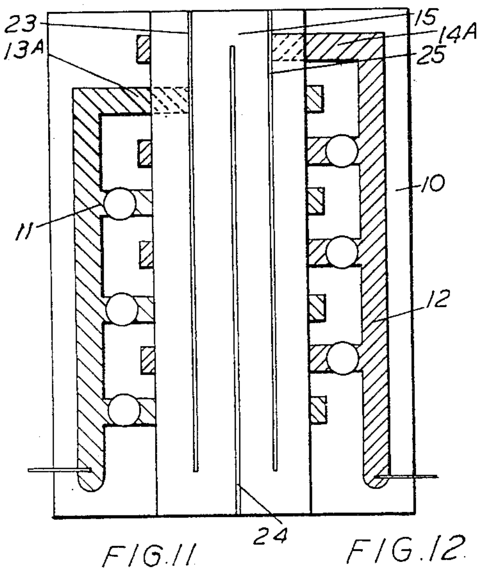
Figure 9 is a plan of a basic resistor component similar to that shown in Figure 2 but modified so as to produce a further form of resistor.

Further ohmic values can be achieved by dividing the effective portion of the resistance band by means of additional slits at right angles to the branches so as to create a meander. Such an arrangement is shown in Figure 9, where the resistance band 15 is slit by three parallel equally spaced slits 23, 24 and 25. The two outer slits 23 and 25 extend from one end of the basic component and the inner slit 24 extends from the other end. By severing the branches 13B, 13C and 13D and the branches 14B, 14C and 14D, for instance by perforations as shown, the resistance band comprises a meander extending downwards from the point where the part to the left of the slit 23 contacts the branch 13A, then up the part of the resistance band between the slits 23 and 24, then down the part of the resistance band between the slits 24 and 25, and finally up the part of the resistance band to the right of the slit 25, until contact is made with the branch 14A. The effective width of the resistor is now quartered, whereas its effective length is approximately quadrupled, thereby increasing its ohmic value by a factor of approximately sixteen. This factor could be raised still higher by increasing the number of slits. It is desirable to fill the slits with an insulating adhesive material to afford adequate strength and to prevent short-circuiting due to the penetration of conductive particles into the slits.

Before the ohmic value has been adjusted the resistance band may be covered with a protective layer, for instance a non-conductive lacquer.

An advantage of the invention is that the component can be mechanically stressed, e. g. folded, even after its ohmic value has been adjusted without disturbing this value, since provision can be made before or during adjustment of the ohmic value for rendering ineffective any portion of the resistance band where a fold is to be made. Thus if this portion is cracked or otherwise damaged during folding it will have no effect on the ohmic value of the component. Part of the resistance band can be rendered ineffective by severing one of the branches close to its stem, for instance the branch 14B as shown in Figure 5, so that the portion of the resistance band lying between the two adjacent branches extending from the other stem (13A and 13B in Figure 5) is not subjected to any difference in potential. The fold may then be made anywhere between the branches 13A and 13B without risk of affecting the ohmic value of the component.

Figure 10:
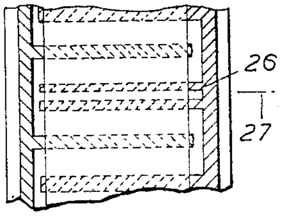
Figure 10 is a fragmentary plan of a form of basic resistor component which is suitable for folding.

Alternatively, as shown in Figure 10, a branch 26 from one of the stems can be duplicated so that the resistance material between the two limbs of the duplicated branch is at all times ineffective. Damage to the resistance material caused by folding the component along the line 27 between the two limbs of the duplicated branch will thus not affect the ohmic value of the component.

If preferred, a resistor of approximately the desired ohmic value could be folded or rolled, a free end being left which can be trimmed after the folding or rolling for effecting fine adjustment of the ohmic value.

The facility for folding or rolling is advantageous in that a resistor of large area can be housed in a relatively small space. A large area is desirable since in this way overheating is minimized. To reduce still further the risk of overheating, the underside of the insulating base 10 may be provided with a layer of foil of a metal of high thermal conductivity such as copper, the arrangement being such that in a folded or rolled insulator the copper foil interleaves the resistance layers while being electrically insulated therefrom, and conducts heat away from the inside of the resistor to a point where it can be dissipated into the atmosphere.

Figure 11:
Figures 11 to 13 are fragmentary views of three insulating tapes provided with different kinds of lines of resistance material for forming resistance paths.
Figure 12:
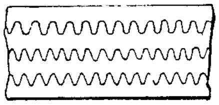
Figure 13:
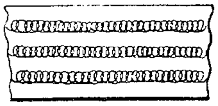

So far, the application of the invention to resistors has been described for the special case where only a single band of resistance material bridges the conductive branches. By providing a plurality of narrow resistance bands or lines so as to form a grating, valuable additional effects can be achieved. While the several resistance bands or lines could be identical with one another this is not essential, and in many cases it may be desirable to provide in a single component several different kinds of resistance bands or lines, for instance bands or lines having different ohmic values per unit length. A convenient way of applying the several resistance bands or lines is to form these on a length of tape of insulating material and to stick this tape over the conductive pattern in the same position as the band 15 in Figures 1 and 2. The resistance lines or bands can, for instance, be drawn on the tape in a resistance ink by applicators. In the case of a line the applicator may be similar to a ball-point pen. Pens may be arranged to draw straight lines as shown in Figure 11, or they may be oscillated or otherwise moved so that they draw wavy or zig-zag lines, as shown in Figure 12, or a pattern of cycloids as shown in Figure 13. Other forms of resistance lines or bands could also be used, and, as indicated above, different kinds of lines could be drawn side by side on the same length of tape.

Figure 14:
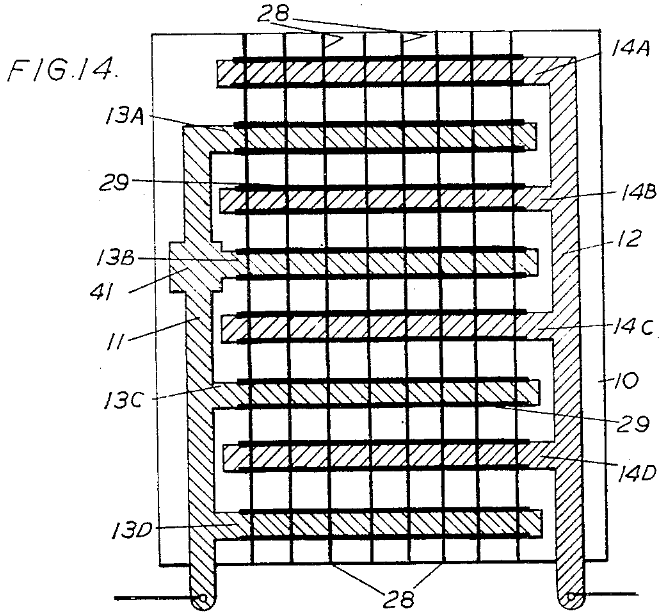
Figures 14 is a plan of another kind of basic resistor component.

Considering a simple case of a resistor of grating form as shown in Figure 14, a pattern of parallel conductive branches is provided which is like the pattern illustrated in Figures 1 and 2, and is mounted on a similar base 10. The branches are bridged by a set of parallel lines 28 of resistance material, these lines lying at right angles to the conductive branches. In order to ensure adequate contact between the resistance lines 28 and the conductive branches, cross-bands 29 of the resistance material are provided at the transition from the resistance lines to the conductive branches. If desired these cross-bands may cover the whole width of the branches.

Figure 15:
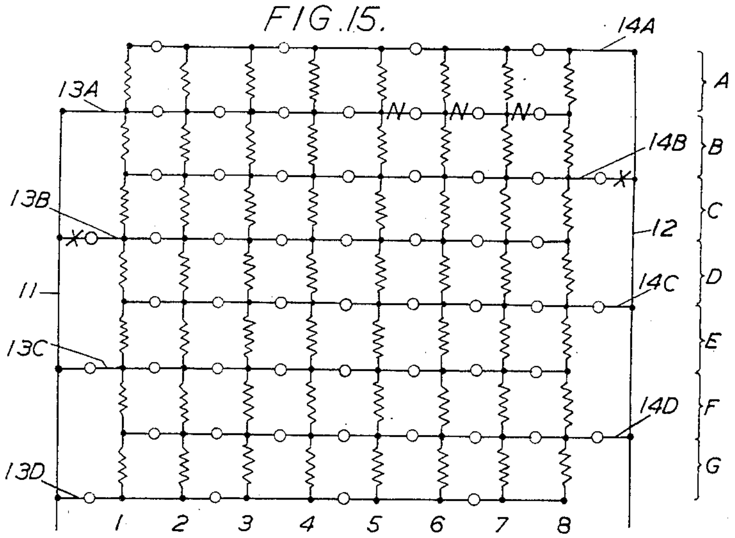
Figure 15 is a diagrammatic view of the basic component shown in Figure 14 illustrating the manner in which resistors of various values can be produced.

The electrical pattern of this embodiment is shown in Figure 15, which indicates seven rows A to G of resistors, each of the conductors 13A to 13D and 14A to 14D between the rows being connected alternately to the stems 11 and 12. In the basic component all the resistors in each row are connected in parallel with one another, the number of resistance units being equal to the number of resistance lines, that is to say eight in the example illustrated. Since there are several branches and alternate branches are connected to the same stem the several rows of resistor units are also connected in parallel with one another. Thus in the basic component shown all the fifty-six resistor units are connected in parallel.

By severing the branches at appropriate points between adjacent resistance lines, or between the outermost resistance lines and the stems from which the branches spring, individual resistor units can be rendered ineffective, or can be connected in series with all or some of the other resistor units, or can be connected partly in parallel and partly in series with other resistor units. Thus by severing the conductive branches at appropriate points a single basic resistor component can be modified to produce resistors of a very wide range of ohmic values, from the minimum ohmic value when all the resistor units are connected in parallel to the maximum ohmic value when all the resistor units are connected in series.

As indicated above, when none of the conductors are severed all the resistor units are connected in parallel. To connect them all in series the conductors must be severed, for instance by punching, at the points marked "O" in Figure 15. In this case all the resistor units (except the unit A1) are connected in series between the stems 11 and 12.

The severing of the conductive branches is conveniently effected by a punching machine arranged to punch holes in the component at appropriate places as described. It is possible to control the operation of the punching machine automatically in dependence on any suitable law. Thus the machine could be arranged first of all to sever pairs of adjacent branches near to their respective stems, for instance at the places marked "X" in Figure 15. The effect of this is to increase threefold the effective lengths of the resistor units connected to these branches. Thus, if the branches 13B and 14B are severed at the points "X" the eight resistors connected between the conductors 13A and 14C will each have three times the ohmic value of one resistor unit. These triple resistors will be in parallel with the single resistor units connected in parallel between the branches 13A and 14A, between the branches 13C and 14D and between the branches 13D and 14D. Control of the punching machine in accordance with this law will afford a coarse adjustment of the ohmic value and when the machine has adjusted the ohmic value of the component to as near a desired law as is possible within the limits of accuracy of this law, the law may be altered either manually or automatically so that the machine will be able to effect a finer adjustment. This finer adjustment could be effected by causing the machine to punch holes in succession along the branches which are still connected to the stems, the punching being effected between the resistance lines and starting from the free end of the branch and proceeding towards the stem to which it is connected. For instance, the branch 13A may be punched successively from right to left at the points marked "N" in Figure 15. The effect of this fine adjustment is to render ineffective the resistor units terminating at the branch in question beyond the perforation nearest to the stem. Thus, in the example just given, the resistor units A6, B6, A7, B7, A8 and B8 are rendered ineffective, since they are now connected only between the branches 14A and 14B which are at the same potential.

As indicated above, series connection of the resistor units may be effected by perforating the branches on both sides of a resistor line except where the current is to flow into or out of this line from or to a conductive stem or another resistance line. The punchings indicated by "O" in Figure 15 represent the extreme example of this.

For producing a given intermediate ohmic value it will generally be possible to adopt any one of a number of alternative schemes of perforation, and it is possible to arrange the punching machine so that it will show a preference for one scheme rather than another. To give an instance, it is generally preferable in a folded or rolled component to arrange that those resistor units which will generate the most heat during operation are nearest to the outside of the component where they will be favourably situated for the purpose of heat dissipation. Accordingly, therefore, the law governing the operation of the punching machine may be such that perforations aimed at disconnecting resistor units and rendering them ineffective are carried out first of all on those units which will be nearest the centre of the rolled or folded components.

Figure 16:
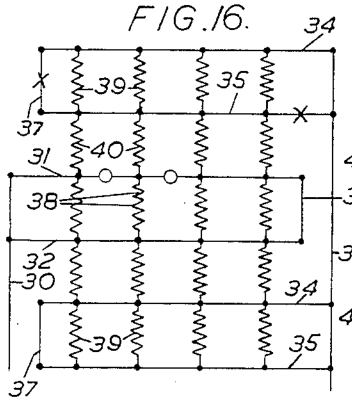
Figure 16 is a diagrammatic view of another form of basic resistor component suitable for folding.

It will be appreciated that the grating arrangement described with reference to Figures 14 and 15 is amenable to numerous modifications. For instance, conductive branches may be duplicated as shown in Figure 16. Thus, in Figure 16, the branches from the stem 30 comprise two arms 31 and 32, while the branches from the stem 33 comprise two arms 34 and 35. Preferably the duplicated branches are not only connected together at the stem but are also connected together at their outer ends beyond the zone shown occupied by the resistor lines, as shown at 36 and 37. The portion of the resistance lines lying between the two arms of a duplicated branch, namely the portions 38 and 39 will therefore normally be ineffective, but if one of the arms of a branch, for instance an arm 35, is severed from its stem and from the other arm 34 by punching it at the points marked "X" in Figure 16, the portions of the resistance line 38 between these arms 34 and 35 will become usable. In other words the effective length of all or some of the resistor units 40 in the adjacent row will be increased. Again, a single resistor unit can be lengthened by perforating one arm of a branch at both sides of this resistor element, for instance at the points marked "O" in Figure 16. If a duplicated branch is not perforated at all, the component can safely be folded along this branch since the resistance lines between both arms of the branch will remain ineffective and any damage to them brought about by the folding will not affect the ohmic value of the component.

It will be understood that perforations can be made at some places in the conductive branches which will have no effect on the ohmic value of the component, for instance, at the extreme ends of the branches beyond the last resistance element (except where these branches are duplicated). Conversely there are places where perforations should not be made, for instance at the junction between the stem and a branch. The conducting material may have a larger area at such places, as indicated at 41 in Figure 14, so that even if a hole is punched there, current paths will still exist around the punched hole. The punching machine could of course be arranged so that it is incapable of punching holes at such forbidden points, but sometimes the mechanism may be simpler if such punching is permitted and steps are taken, such as that just described, for rendering such punching harmless. In some cases the fact that the holes can be punched through the component without affecting its ohmic value can be turned to advantage, in that holes may be punched at such harmless places and used for registration purposes or for giving an indication of lines at which folding is permissible.

It is not necessary for the conductive branches to be at right angles to the stems. For instance, in one form of the invention auxiliary conductors extend at right angles from the stems, and the branches extend from the auxiliary conductors so as to lie parallel with the stems. In this case the resistance lines will run at right angles to the branches and to the stems and parallel to the auxiliary conductors.

Figure 17:
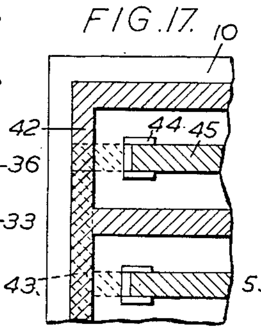
Figures 17 and 18 are, respectively, a fragmentary plan and cross-section of a basic resistor component in which terminal parts of the conductive areas are both at the same edge of the component.
Figure 18:
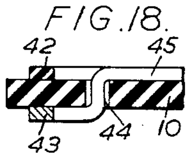

In a component such as those illustrated in Figures 2, 9 and 14, where the branches extend inwardly from stems at opposite edges of the component and where fine adjustment of the ohmic value is effected by perforating branches, the perforations in one branch must run from right to left while the perforations in an adjacent branch must run from left to right. In some cases this may be inconvenient, and it may be preferable to arrange for both sets of branches to extend from the same edge of the component so that all perforation can be done in the same direction. This involves locating both stems at the same edge of the component and hence the provision of cross-overs. A simple way of effecting such cross-overs is to provide a spot of insulation between crossing conductors. Alternatively, as shown in Figures 17 and 18, one stem 42 could be mounted on top of the base 10 and the other stem 43 could be mounted underneath the base, the stem lying underneath being connected through perforations 44 in the base to its appropriate branches 45 on the top of the base. Instead of passing the actual branch through the hole 44 as shown in Figure 18, the left-hand ends of the branches 45 on the top of the base may be connected to tongues projecting to the right from the underneath stem 43 by means of wire staples or eyelets which pass through the base 10 from top to bottom.

Figure 19:
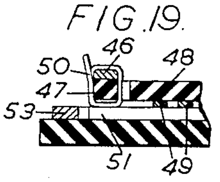
Figures 19 and 20 are, respectively, a fragmentary cross-section and plan illustrating another basic resistor component in which terminal parts of the conductive areas are both at the same edge of the component.
Figure 20:
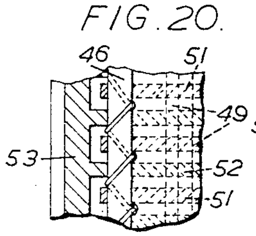

Another way of making the connections from a stem to its appropriate branches while avoiding contact with the other branches is shown in Figures 19 and 20. In this case one stem 46 is mounted on an insulating former 47 and shaped so that it projects below the former 47 only at points where connections with appropriate branches are to be made. Conveniently the former 47 comprises the edge of an insulating label or strip 48 which carries on its underside the resistance lines 49. A helix of tinned wire 50 is coiled around the stem 46 and the former 47 so that the underneath portions of the turns of the helix lie on the left-hand ends of one set of branches 51, while the other set of branches 52 are connected to a stem 53. The pitch of the wire helix 50 is equal to the spacing of the branches 51 to which the wire is to be connected, so the wire will not make contact with the branches 52 because when aligned with these branches it will be on top of the stem 46.

Figure 21:
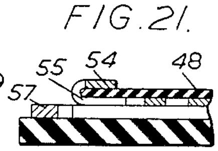
Figures 21 and 22 are, respectively, a fragmentary cross-section and plan illustrating yet another basic resistor component in which terminal parts of the conductive areas are both at the same edge of the component.
Figure 22:
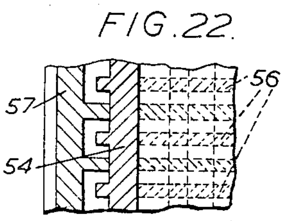

In an alternative arrangement shown in Figures 21 and 22, one stem consists of a comb-shaped member 54 fitted over the edge of the insulating label or strip 48 with the tips of its teeth 55 turned under the edge and its continuous backing lying above the edge. The turned-under teeth make contact with alternate branches 56, the pitch of the teeth being equal to the spacing of these branches.

In a modified arrangement the branches extend between and are connected to duplicated stems similar to the stems 42, 43 of Figures 17 and 18, or 46, 53 of Figures 19 and 20, or 54, 57 of Figures 21 and 22, arranged at opposite edges of the component. There are therefore at both edges of the components two stems which are electrically isolated by crossover arrangements as described above. An advantage of this arrangement is that the component can be perforated from the centre outwards so that any ineffective resistor units will always lie at or near the centre of the component, which is advantageous from the point of view of heat dissipation.

Figure 23:
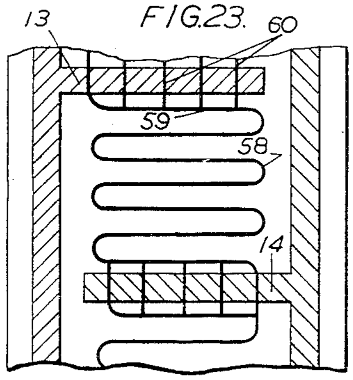
Figures 23 to 26 are plans of four further forms of basic resistor components.

Instead of causing the resistance lines to proceed straight from one branch to the next they may be arranged in a sinuous path or meander. One such arrangement is shown in Figure 23 where the resistance line 58 proceeds from one branch 13 to the adjacent branch 14 in a series of loops. In order to ensure continuity at the connection between the resistance line and the branch, the loop 59 of the resistance line which lies closest to the branch is preferably connected to the branch by several parallel line connectors 60. If desired such line connectors may extend right across the branch to serve also for the adjacent meander, as shown in the drawing. Alternatively, instead of providing a plurality of such connectors 60 a similar expedient to that shown in Figure 14 can be adopted, namely the provision of a wide crossband such as 29 at the transition between the resistance line 58 and the appropriate branch 13 or 14.

Figure 24:
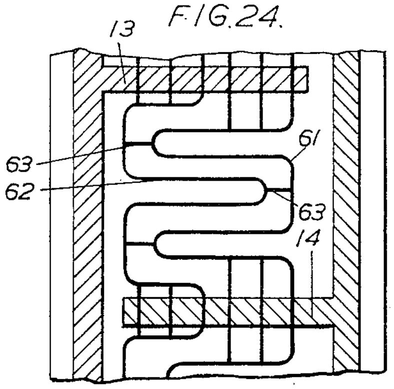

Another meander arrangement is shown in Figure 24. In this case there are two resistance lines 61 and 62 which run in parallel with one another between the branches 13 and 14. Cross links 63 are provided at intervals to ensure continuity should a break occur in one of the lines.

Figure 25:
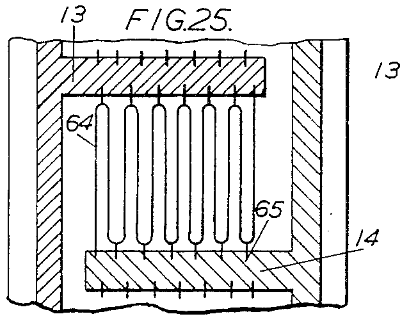

In a further arrangement, shown in Figure 25, the resistance line 64 is in the form of a meander, but connecting links 65 join the ends of the loops of the meander to the branches 13 and 14 so that all the loops are disposed in parallel with one another between the branches.

Figure 26:
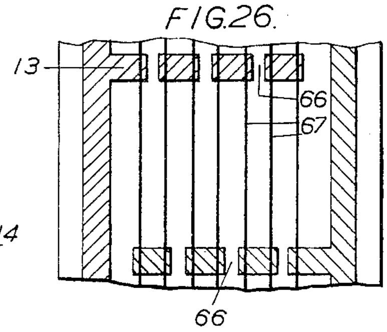

In the arrangement shown in Figure 26 the branches are divided by gaps 66, and although the resistance lines 67 are all geometrically in parallel, electrically they are connected in series between the branch 13 and the branch 14.

A convenient way of applying the resistance lines in the arrangement shown in Figures 23 to 26 is to print or otherwise form these lines on an insulating strip of paper and then to stick this strip, printed side down, on to a preformed pattern of conductive areas prepared by a printed circuit technique.

The examples described above are all resistor components. A capacitor component will now be described.

Figure 27:
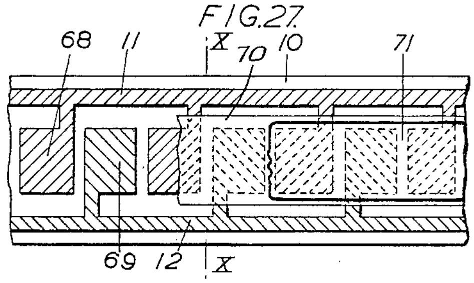
Figures 27, 28 and 29 are, respectively, a plan, a longitudinal section and a cross-section of a basic capacitor component.
Figure 28:
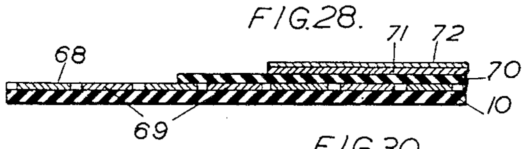
Figure 29:
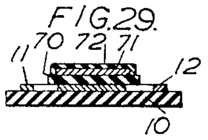

In the capacitor component, illustrated in Figures 27 to 29, there is an insulating base 10 on which is formed a conductive pattern somewhat similar to that described above in respect of resistors, in that it consists of stems 11 and 12 having interdigitated branches 68 and 69 respectively. In this case the branches are broader in relation to their length than are the branches employed in the case of resistors, and the gaps between the branches can be quite small. Bridging the branches there is a band 70 of a dielectric material, preferably of high dielectric constant. This dielectric material may include high permittivity inclusions after the manner described in the specification of United States patent application Serial No. 238,668 filed July 26, 1951. An electrically isolated band 71 of conductive material such as metal foil is superimposed over the exposed surface of the dielectric. The large majority of the electrostatic field lines, therefore, will pass from the upper surface of one branch, for instance the branch 68, to the superimposed conductive band 71 and then from the band 71 to the upper surface of the adjacent branch 69. The capacity of each capacitor unit will therefore be approximately equal to that of a capacitor having an electrode area equal to the surface area of the branch 68 or 69 and a dielectric thickness equal to twice the thickness of the band of dielectric material 70. The conductive band 71 is preferably protected by means of a non-conductive protective layer 72 such as an acetate film.

If desired, for increasing the capacity value of the component, the base 10 may be made of dielectric material and another band of conductive material similar to the band 71 may be placed beneath the base 10 so that a further set of capacitor units is formed. This arrangement has the advantage that stray capacitor effects which might otherwise occur if a conductor were brought close to the underside of the foil, or in folding or rolling the component, are substantially eliminated.

The conductive band can be, if preferred, a very thin mirror layer of silver, or any other form of extremely thin metal deposit, so that a capacitor made with such a metallised layer in the dielectric will have self-healing properties.

A preferred method of manufacturing such a component consists of using a thin plastic or paper tape on which a thin film of aluminium has been deposited by vacuum deposition, this aluminised tape being coated with a very thin dielectric film. This dielectric film may comprise, for example, a heat-curing varnish heavily pigmented with high permittivity titanates, or a self-adhesive low-loss polystyrene lacquer, or a heat-sealing polythene film, or a high temperature resisting silicone coating. The metallic pattern of branches will normally also be covered with a similar dielectric film and the tape will be applied like a label and bonded in place by heat and pressure, or by pressure only, according to the nature of the dielectric. In cases where the tape is made in accordance with the invention described in United States patent application Serial No. 238,668 referred to above the metallic pattern will be kept blank and the dielectric bonded to this pattern, preferably by heat-curing of the binding medium which holds together the high permittivity flakes. The aluminised tape could also be cemented to the metallic pattern by wetting either the tape or the metallic pattern with a liquid solvent or softener for the binder and then keeping the tape pressed in position until the solvent or softener has evaporated. In such cases the binder either must not be fully cured prior to the application of the tape, or must be one which is capable of being made sticky.

For components having small capacity values the metallic layer may be on the back of the insulating base for the pattern of branches, the insulating base in this case being thin and itself serving as the dielectric.

Instead of relying on the self-healing properties of the very thin metal layer, the invention described in United States Patent No. 2,607,825 may be employed. In this case the metallic layer would be covered on one side with a thin dielectric film, its other side would be protected by an insulating backing or by some other etch resistant coating, and the multilayer material would then be passed through an etching bath so that the metal on and adjacent to any pin-hole through the dielectric would be removed. In a particular form of this aspect of the invention the same metal or type of metal is used for the metallic layer as is used for the branches, and a printed circuit pattern is produced by printing and etching a metal foil bonded to an impervious thin flexible insulator as described in United States Patent No. 2,441,960. The pattern is so arranged that the branches and the area which is to be the conductive layer are formed simultaneously and in the same plane, and the conductive layer is then superimposed over the branches by folding the insulating base, a layer of dielectric material being applied over appropriate areas of the metallic parts before the folding. The finished product would therefore consist of two layers of dielectric material sandwiched between the branches of the superimposed conductive layer. The presence of two dielectric layers will considerably reduce the risk of leakage through pinholes in the dielectric. Further safety can be achieved, however, if the material is etched again after the application of the dielectric film and before the folding operation, to remove any metal underlying and adjacent to any pin-holes in the dielectric film. If desired the ink used as an etch-resist during the formation of the metallic pattern can be retained as the dielectric, in which case the operation of cleaning away the etch-resist, coating the pattern with a dielectric film, and subjecting it to a second etching treatment are all dispensed with.

If the base 10 is itself a dielectric and is folded so that the undersides of the base come together, a second etching treatment is also unnecessary, since the etching treatment employed for creating the conductive pattern will have rectified any pin-hole defects.

Each capacitor component consists of a plurality of capacitor units connected in parallel, and the total capacity can be adjusted by rendering some of these units inoperative by severing portions of the component by cuts which are parallel to the branches and which pass between adjacent branches, such as on the line X—X in Figure 27, or by equivalent punch holes through the branches where they join the stems, or by cutting the stems.

When the dielectric is thin steps must be taken to ensure that burring-over of a conductive layer at the edges of cuts or punch-holes will not produce a low-resistance leakage path across the thickness of the dielectric. One way of ensuring this is to make the conductive band 71 narrower than the conductive pattern and to confine the cuts or punches to places where only one conductive layer is present, for instance at the margins of the component beyond the limits of the conductive band 71, or along the gaps between the conductive areas 68 and 69, such as on the line X—X. In other words, two conductive layers must not overlap in the places where cuts or punch holes may have to be made.

The capacitor component can safely be rolled or folded without affecting its value, if the capacitor unit along the length of the fold is rendered ineffective by cutting or punching as described above.

In the case of components which rely on the properties of semi-conductors, such as light-sensitive, temperature-sensitive or strain-sensitive components, the arrangement may be similar to that described above with respect to resistors, the resistance material being replaced by a band or lines of an appropriate semi-conductor. In certain cases special techniques are necessary. For instance, if the conductive elements of the component are copper foil and it is desired to use a lead sulphide mirror as the semi-conductor, it is necessary first of all to treat the copper, in the places where it is to make contact with the lead sulphide mirror, with an agent which will promote adhesion between these substances, since in the ordinary way lead sulphide will not adhere to copper. One way of doing this is to silver the copper in the appropriate areas, since silver will adhere to copper and lead sulphide will adhere to silver. A similar technique can be employed where the electrically active material comprises a polyester film, polymerised in situ, since in the ordinary way copper would inhibit the polymerisation.

Figure 30:
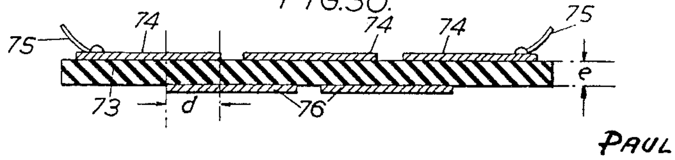
Figure 30 is a sectional view of a basic resistor component having conductive areas on both sides of a sheet of resistance material.

In the arrangements described above for resistors, capacitors and semi-conductors the highly conductive areas and the electrically active material are both applied to the same side of a support consisting of a sheet of insulating material. In certain forms of resistor and semi-conductor components embodying the invention, however, the separate support can be dispensed with and the resistance or semi-conductor material itself can be provided in sheet form to act as the support. Such an arrangement is shown in Figure 30, where the support comprises a sheet of resistance material 73. Formed on one surface of the support 73 are several highly conductive areas 74 which are spaced apart by narrow gaps, and the end pair of which constitute terminal areas to which lead-in wires or other conductors 75 can be connected. On the other surface of the support are highly conductive areas 76 which are also spaced apart by narrow gaps and which overlap the areas 74 on the first mentioned surface of the support. As will be seen from Figure 30, a current can now flow between the conductors 75 by passing through one terminal area 74, down through the thickness of the resistance support to the overlapping underlying area 76, then up again to an intermediate area 74, and so on, the number of times which the current has to traverse the thickness of the sheet depending upon the number of overlapping highly conductive areas which are provided. Such an arrangement, therefore, provides a plurality of resistor units in series, each unit having a cross-sectional area equal to the product of the width of the conductive areas 74 or 76 and the amount of overlap *d*, while the length of each resistor unit is equal to the thickness *e* of the resistance sheet. There may be a plane insulating layer or a metal-clad insulating layer over the whole or part of one or both sides of the component.

Figures 31, 32, 33, 34:
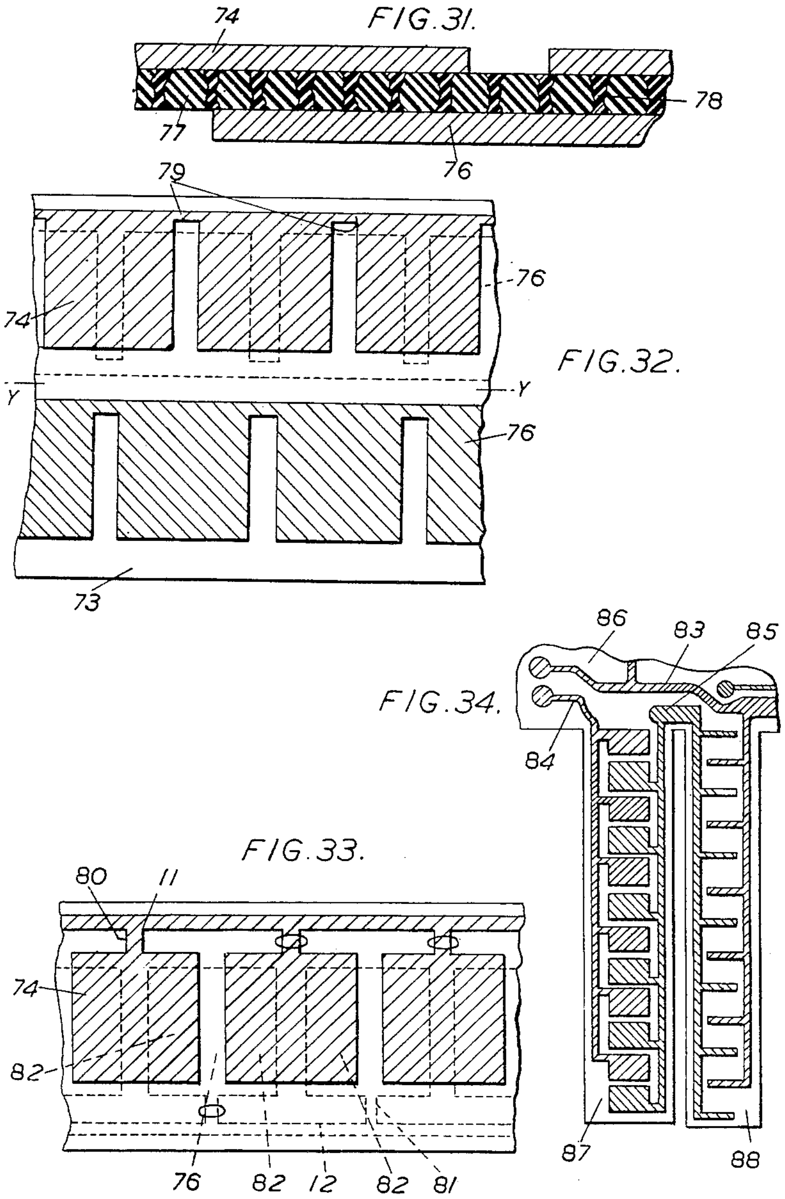
Figure 31 is a detail of Figure 30 on a larger scale.
Figures 32 and 33 are fragmentary plans of two alternative forms of basic resistor components embodying the principles illustrated in Figures 30 and 31.
Figure 34 shows a part of a printed electric circuit embodying the present invention.

While the resistance sheet may be homogeneous, for certain applications it is desirable to provide a resistance sheet of a rather different form. For instance, the resistors may be required to operate at high temperature or under other difficult conditions, for which no available homogeneous resistance sheet would be suitable. In such a case a heterogeneous resistance sheet may be provided. As shown in Figure 31 this may consist of a large number of particles 77 of a suitable resistance material embedded in a matrix 78 which holds the particles together. The particles are each of such structure as to form the whole or part of a current path from one side of the resistance sheet to the other. For instance, the particles are preferably of such size that they extend through the whole thickness of the sheet, so that their opposite ends are in contact with the respective overlapping conductive areas 74 and 76, thus providing an array of parallel current paths between the said conductive areas. Conductive cements may be used for sticking the particles to the conductive areas and to complete the current paths between the particles and the conductive areas. The material of the matrix can be any insulating adhesive compound having the desired stability at the operating conditions. By the use of a suitable matrix material a very heat-stable yet quite flexible unit can be achieved. This form of the invention considerably widens the range of resistance materials which may be used for the resistance sheet, since it enables resistance materials to be used which are not obtainable in sheet form, or are not easily produced as layers or films, or which are too brittle for normal usage, or are such that the conductive areas would not adhere to them. For example, in the case of pure resistance components vitreous materials in the form of brittle crystals can be used. In the case of components relying upon the properties of semi-conductors, brittle semi-conductor crystals such as germanium crystals can be used, which would not ordinarily be usable in a flexible component.

Figure 32 is a plan view indicating how the conductive areas of a component such as that shown in Figures 30 and 31 could be arranged. In this case the base 73 comprises a thin layer of resistance material and two sets of conductive areas 74 and 76 are formed on its surface as illustrated. If then the material is folded on the line Y—Y, a double thickness resistance layer is produced with the highly conductive areas 74 on one side and the highly conductive areas 76 on the other side, as shown by dotted lines in the drawing. Such an arrangement in effect constitutes only two electrodes since all the areas 74 or 76 respectively are connected together by narrow bridges 79. In this arrangement, therefore, all the resistance units are connected in parallel. The values can be adjusted, however, by severing the bridges 79 as required in order that the current path through some or all of the resistance units will be a series path.

A slightly modified arrangement is shown in Figure 33 in which the conductive areas 74 and 76 respectively are connected to stems 11 and 12 by necks 80 and 81 respectively. The conductive areas can thus be severed from the stems without severing the stems themselves, for instance by punching holes through the necks 80 or 81. If punched holes are provided as shown in Figure 33, for example, the three resistance units 82 will all be connected in series between the branches 11 and 12.

It will be appreciated that by having a multiplicity of such areas, for instance providing several rows of such areas side by side with interconnecting bridges between them a wide variety of resistance values can be achieved by severing appropriate bridges.

The invention can conveniently be employed in the manufacture of electronic circuits, more especially those manufactured by printed circuit techniques. In such cases, as in the fragment shown in Figure 34, where the conductive parts of the circuit are in the form of metallic foil areas 83, 84 and 85 mounted on a flexible insulating support 86, the circuit may be designed so that extending from one or more of its edges are tags 87, 88 of the support material with imposed thereon the inter-digitated patterns of conductive areas which form part of the present invention. Thus the pattern shown on the tag 87 is suitable for the formation of capacitators, while the pattern shown on the tag 88 is suitable for the formation of resistors. These tags are then provided with bands or lines of appropriate resistance or dielectric or semi-conducting materials in the manner described, to constitute resistors, capacitators or semi-conducting components as may be required in the circuit. These components can be modified to bring them to the required values as described above, and the tags can be rolled or folded to bring them within the limits of the main part of the circuit. The components could be formed in the interior of the circuit, but in such cases the adjustment of the values or the folding of the components may be less convenient than where the components are disposed around the periphery of the circuit.

It will be understood that the foregoing descriptions are given by way of example, and that many extensions and modifications are permissible without departing from the invention. For instance, the base or support need not be plane, but could equally well be a curved surface. Also, a rigid base or support may be used in place of a flexible one, but in this case the components would not be rolled or folded.

An intermediate variety of component would be a tape arranged rather after the manner of a chain, consisting of stiff elements linked by flexible sections so as to permit rolling and folding of the tape without distortion of the stiff elements.

Figure 31 illustrates the principle and represents a special case of such an arrangement, in which the smallest possible stiff elements, namely the particles 77, are linked by flexible sections constituted by the intervening sections of flexible matrix material 78. The principle is capable of extension to stiff sections of all sizes ranging from particle size, as just described, up to quite large flake-like or slab like plates. The flat surfaces of such plates may be coated with conductive material to improve the contact with the conductive areas. This arrangement enables ceramic or other rigid elements to be used in a folded or rolled component. Thus high permittivity ceramic plates or mica flakes, metallised on one side by firing, may form the stiff elements in a capacitor component, while thin ceramic plates, needles or rods on which carbon has been cracked on, or on which a nickel-chrome-magnesium-fluoride coating has been applied by vacuum deposition, may constitute the stiff elements of a resistor component. For semi-conductor components the stiff elements may consist of germanium crystals or bodies of suitable metallic oxides or other semi-conductors, which may be conductively coated on their surfaces which contact the conductive areas. The flexible sections and stiff elements in some cases may be supported by an insulating tape of any suitable kind, for instance a self-adhesive glass cloth tape on which the stiff elements are stuck, while in other cases the conductive areas themselves may provide the support, especially where the conductive areas are made of metal foil and are thus flexible and strong.

The metallic branches of the conductive pattern, are preferably made from metal foil and are therefore very flexible, and may be coated with a conductive cement, which may also have served as the etch-resistant ink in the production of the pattern according to the process described in United States Patent No. 2,441,960.

This conductive cement may be used to bond the stiff elements of the components conductively to the metallic conductors which form their terminals, for instance the conductive areas 74 and 76 in Figure 32.

In all the components described, more especially those intended for folding or rolling, the base may be backed with metal foil, which may be additionally insulated if desired to provide electrostatic shielding, or for conducting heat away from interior parts of the components, or for both these purposes.

In certain of the arrangements described, the electrical values may be adjusted by connecting conductive areas together instead of by severing them. For instance, in Figure 30 connecting together two adjacent conductive areas 74 will have the effect of short circuiting two resistance paths.

What I claim as my invention and desire to secure by Letters Patent is:

1. A basic electric circuit component comprising a base in form of a thin pliable insulation sheet, at least two separate highly conductive areas each having a plurality of branches supported on said sheet adhering thereto, the branches of one highly conductive area being spaced from the branches of another highly conductive area, a layer of impedance determining material adhered to said sheet, said layer forming a plurality of pathways disposed in at least one limited region of said sheet, each of said pathways having its ends connected to branches of different highly conductive areas, and each of said highly conductive areas further having parts forming conductive links between the respective branches and the respective ends of said pathways connected thereto, said conductive links being disposed on the sheet outside said limited region of said sheet, to permit mechanically stressing of said links without appreciably affecting the electric values of said pathways.

2. A basic electric circuit component as claimed in claim 1 in which one of said highly conductive areas is formed with holes therethrough for altering the electrical value of the component.

3. A basic electric circuit component as claimed in claim 1 in which the highly conductive areas and the pathways formed by said impedance determining material are disposed in a spatial relationship in which a progressive alteration in electrical value is obtainable by progressively severing at least one of said areas along at least one line.

4. A basic electric circuit component as claimed in claim 1 in which the highly conductive areas and the pathways formed by said impedance determining material are disposed in a spatial relationship in which a progressive coarse alteration in electrical value is obtainable by progressively severing at least one of said areas along at least one line and a progressive finer alteration in electrical value is obtainable by progressively severing at least one of said areas along at least one other line.

5. A basic electric circuit component as claimed in claim 1 in which the highly conductive areas comprise residual areas of at least one sheet of metal foil from which unwanted areas have been removed.

6. A basic electric circuit material as claimed in claim 1 in which the impedance determining material is in the form of a tape.

7. A basic electric circuit material as claimed in claim 1 comprising a tape supporting the impedance determining material.

8. A basic electric circuit component as claimed in claim 1 in which the separate highly conductive areas are supported on one side of the insulation base, and the pathways formed by the impedance determining material which connect these conductive areas are supported on the same side of the base.

9. The modification of the basic electric circuit component as claimed in claim 1 in which the impedance determining material is in sheet form and the separate highly conductive areas are supported on opposite sides of said sheet, and in which the said branches extend through the thickness of the sheet from a highly conductive area on one side of the sheet to an overlapping highly conductive area on the opposite side of the sheet.

10. A basic electric circuit component as claimed in claim 9 in which a plurality of separate highly conductive areas are supported on both sides of the sheet, two of said areas constituting input and output terminal areas, the said highly conductive areas including overlapping portions, said overlapping portions and the impedance determining material therebetween forming a connection between the said terminal areas.

11. A basic electric circuit component as claimed in claim 1 in which said highly conductive areas are arranged in at least two layers, at least one conductive area constitutes a terminal of the component, and at least one other conductive area spaced therefrom is in contact with the impedance determining material and provides a link between at least two of said pathways of impedance determining material.

12. A basic electric circuit component as claimed in claim 1 which also includes a layer of metal foil for conducting heat away from parts of the component which generate heat when in use.

13. A basic electric circuit component as claimed in claim 1 in which the impedance determining material comprises brittle members forming parallel current paths between the highly conductive areas and a non-brittle matrix in which said brittle members are embedded.

14. A basic electric circuit component as claimed in claim 13 in which said brittle members are semi-conductors.

15. A basic electric circuit component as claimed in claim 13 in which said brittle members are in the form of flat slabs.

16. A basic electric circuit component according to claim 1, wherein the said link forming parts of the highly conductive areas are disposed outside said region occupied by the impedance determining material and in positions in which said links and said branches are selectively severable for forming circuit components having electric values different one from another.

17. A basic electric circuit component comprising a base in form of a thin insulation sheet, at least two highly conductive areas supported on said sheet adhering thereto and each having a plurality of branches, the branches of one area being interdigitated between but spaced from the branches of another highly conductive area, a layer of impedance determining material supported on said sheet, said layer forming a plurality of pathways bridging said interdigitated branches, each of said pathways having its ends connected to branches of different highly conductive areas, and each of said highly conductive areas further having parts forming conductive links between the areas of said pathways connected thereto, the said conductive links being disposed on the sheet in areas spatially separated from said pathways to permit mechanical stressing of said links without appreciably affecting the electric values of said pathways.

18. A basic electric circuit component as claimed in claim 17 which is a resistor component and in which said pathways are in form of a band of resistance material bridging the branches of the highly conductive areas.

19. A basic electric circuit resistor component as claimed in claim 18 in which the said band of resistance material is of a width such that the ohmic resistance value of the component is adjustable by providing cuts running lengthwise along the resistance band.

20. A basic electric circuit component as claimed in claim 17 which is a resistor component and in which the said pathways bridging the branches of the highly conductive areas comprise a plurality of lines of resistance material in form of a grid-like arrangement of resistance lines crossing the branches.

21. A basic electric circuit resistor component as claimed in claim 20 in which at least two of said resistance lines have different ohmic values per unit length.

22. A basic electric circuit component as claimed in claim 17 which is a capacitor component and in which the impedance determining material which bridges the branches is a dielectric material, and in which an electrically isolated highly conductive layer is superimposed over the surface of the dielectric material remote from the branches.

References Cited in the file of this patent

UNITED STATES PATENTS

| | | |
|---|---|---|
| 1,794,831 | Caruso | Mar. 3, 1931 |
| 2,216,558 | Ortlieb | Oct. 1, 1940 |
| 2,216,559 | Ortlieb | Oct. 1, 1940 |
| 2,464,377 | Cohen | Mar. 15, 1949 |
| 2,474,988 | Sargrove | July 5, 1949 |
| 2,493,199 | Khouri | Jan. 3, 1950 |
| 2,611,040 | Brunetti | Sept. 16, 1952 |
| 2,613,252 | Heibel | Oct. 7, 1952 |
| 2,629,166 | Marsten | Feb. 24, 1953 |